(12) United States Patent
Chiang et al.

(10) Patent No.: US 9,608,012 B2
(45) Date of Patent: Mar. 28, 2017

(54) DISPLAY PANEL

(71) Applicant: InnoLux Corporation, Miao-Li County (TW)

(72) Inventors: Kuo-Chang Chiang, Miao-Li County (TW); Kuan-Feng Lee, Miao-Li County (TW); Peng-Cheng Huang, Miao-Li County (TW); Kuei-Ling Liu, Miao-Li County (TW)

(73) Assignee: INNOLUX CORPORATION (TW)

( * ) Notice: Subject to any disclaimer, the term of this patent is extended or adjusted under 35 U.S.C. 154(b) by 0 days.

(21) Appl. No.: 14/831,040

(22) Filed: Aug. 20, 2015

(65) Prior Publication Data
US 2016/0223845 A1  Aug. 4, 2016

(30) Foreign Application Priority Data

Jan. 30, 2015  (TW) .............................. 104103165 A
Jul. 22, 2015  (TW) .............................. 104123658 A

(51) Int. Cl.
*H01L 27/12*    (2006.01)
*H01L 27/32*    (2006.01)
*G02F 1/1337*   (2006.01)

(52) U.S. Cl.
CPC ...... *H01L 27/124* (2013.01); *G02F 1/133788* (2013.01); *H01L 27/3232* (2013.01); *H01L 27/3241* (2013.01); *G02F 2001/133776* (2013.01)

(58) Field of Classification Search
CPC  H01L 27/124; H01L 27/3232; H01L 27/3241
See application file for complete search history.

(56) References Cited

U.S. PATENT DOCUMENTS 9,362,314 B2 * 6/2016 Hsu ..................... H01L 29/7869
2015/0310811 A1 * 10/2015 Huang .............. G02F 1/133703
                                                             345/205

FOREIGN PATENT DOCUMENTS

CN            203930285 U       11/2014

* cited by examiner

*Primary Examiner* — Phat X Cao
(74) *Attorney, Agent, or Firm* — Bacon & Thomas, PLLC

(57) ABSTRACT

A display panel is disclosed, comprising: a first substrate; a thin film transistor layer disposed on the first substrate; an insulating layer disposed on the thin film transistor layer; at least one pixel electrode disposed on the insulating layer and exposing an exposure region of the insulating layer; and an alignment layer disposed on the pixel electrode and the exposure region; wherein a surface roughness of the alignment layer disposed on the exposure region is larger than a surface roughness of the alignment layer disposed on the pixel electrode.

10 Claims, 5 Drawing Sheets

DISPLAY PANEL

CROSS REFERENCE TO RELATED APPLICATION

This application claims the benefits of the Taiwan Patent Application Serial Number 104103165 and 104123658, respectively filed on Jan. 30, 2015 and Jul. 22, 2015, the subject matter of which is incorporated herein by reference.

BACKGROUND OF THE INVENTION

1. Field of the Invention

The disclosure relates to a display panel, and particularly to a display panel where light leakage is not liable to occur.

2. Description of Related Art

With the progressing development of display technology, all the devices are developed following the trend of minimization, thinness, light weight and so on, and the mainstream display devices have evolved from cathode ray tubes (CRT) to the liquid crystal displays (LCDs). In particular, the liquid crystal displays can be applied in various fields of daily life, such as a mobile phone, a notebook computer, a camcorder, a camera, a music player, a mobile navigation device, a television and the like, and a liquid crystal display panel is typically used as their display panels.

Today, the liquid crystal display development technology has matured progressively, while the manufacturers still endeavor to improve the display quality of the display device to meet consumers' demands. Accordingly, it remains a need in the art to develop a display device with an improved display quality to reduce the light leakage problem for providing a more stable display performance for consumers.

SUMMARY OF THE INVENTION

An object of the disclosure is to provide a display panel, which is capable of reducing the light leakage.

In order to achieve the above object, the disclosure provides a display panel, comprising: a first substrate; a thin film transistor layer disposed on the first substrate; an insulating layer disposed on the thin film transistor layer; at least one pixel electrode disposed on the insulating layer and exposing an exposure region of the insulating layer; and an alignment layer disposed on the pixel electrode and the exposure region; wherein a surface roughness of the alignment layer disposed on the exposure region is larger than a surface roughness of the alignment layer disposed on the pixel electrode.

Accordingly, since the surface roughness of the alignment layer disposed on the exposure region is larger than the surface roughness of the alignment layer disposed on the pixel electrode, the alignment direction of the liquid crystal molecules in the liquid crystal layer are changed by influence of the non-uniform alignment layer. Upon driving the display panel, the liquid crystal molecules disposed on the alignment layer corresponding to the pixel electrodes are arranged obliquely by the effect of the electric field; while the liquid crystal molecules disposed on the alignment layer corresponding to the exposure region are less susceptible to the electric field due to its larger surface roughness and light leakage can be reduced.

DETAILED DESCRIPTION OF THE EMBODIMENT

Hereinafter, exemplary examples of the disclosure will be described in detail. However, the disclosure is not limited to the examples disclosed below, but can be implemented in various forms. The following examples are described in order to enable those of ordinary skill in the art to embody and practice the disclosure, and those skilled in the art will appreciate that various modifications, additions and substitutions are possible.

Figure 1A:
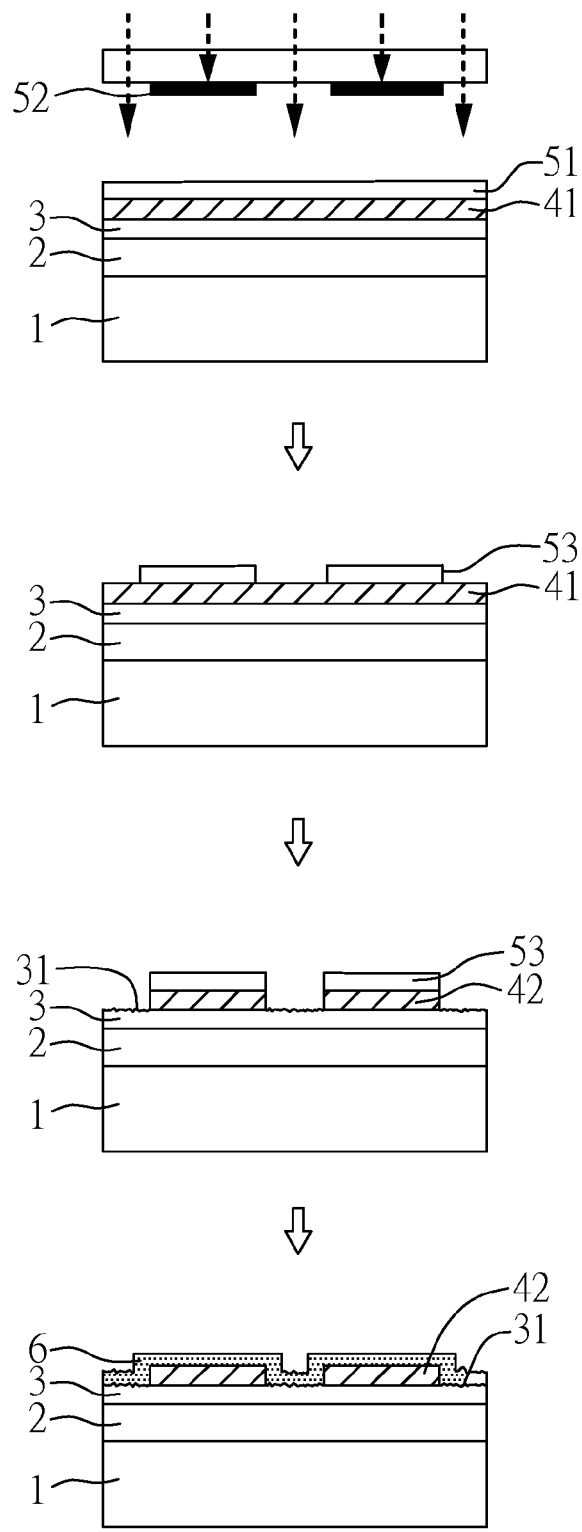
FIG. 1A shows a preparation scheme of the display panel according to an embodiment of the disclosure.

The disclosure provides a display panel, as shown in FIG. 1A, comprising: a substrate 1, a thin film transistor layer 2, an insulating layer 3, the pixel electrode 42 and an alignment layer 6. The thin film transistor layer 2, the insulating layer 3 and the pixel electrode 42 are sequentially disposed on the substrate 1. The pixel electrode 42 is disposed on the insulating layer 3 and exposes an exposure region 31 of the insulating layer 3, while the alignment layer 6 is disposed on the pixel electrode 42 and the exposure region, wherein a surface roughness of the alignment layer 6 disposed on the exposure region 31 is larger than a surface roughness of the alignment layer 6 disposed on the pixel electrode 42.

Please refer to FIG. 1A, which shows a preparation scheme of the display panel. First, a substrate 1 is provided, and then a thin film transistor layer 2 is prepared on the substrate 1 by lithography and etching technology. After that, an insulating layer 3 is disposed on the thin film transistor layer, and a transparent conductive layer 41 is disposed on the insulating layer 3. Next, a photoresist layer 51 is provided on the transparent conductive layer 41, and a mask 52 having a predetermined pattern is employed for an exposure process (the illumination direction is indicated by the dashed arrows), to form a patterned photoresist 53, and then an etching solution is used to etch the transparent conductive layer 41 for patterning, so as to form a pixel electrode 42 and expose part of the insulating layer 3 (i.e., an exposure region 31). At this time, the etching solution is further used to etch the insulating layer 3 of the exposure region 31, such that the insulating layer 3 of the exposure region 31 not covered by the patterned photoresist 53 and the pixel electrode 42 has an uneven surface. Finally, the patterned photoresist 53 is removed, and then an alignment layer 6 is formed on the pixel electrode 42 and the exposure region 31, wherein, since the insulating layer 3 of the exposure region 31 has an uneven surface, a surface roughness of the alignment layer 6 disposed on the exposure region 31 is larger than a surface roughness of the alignment layer 6 disposed on the pixel electrode 42.

Figure 1B:
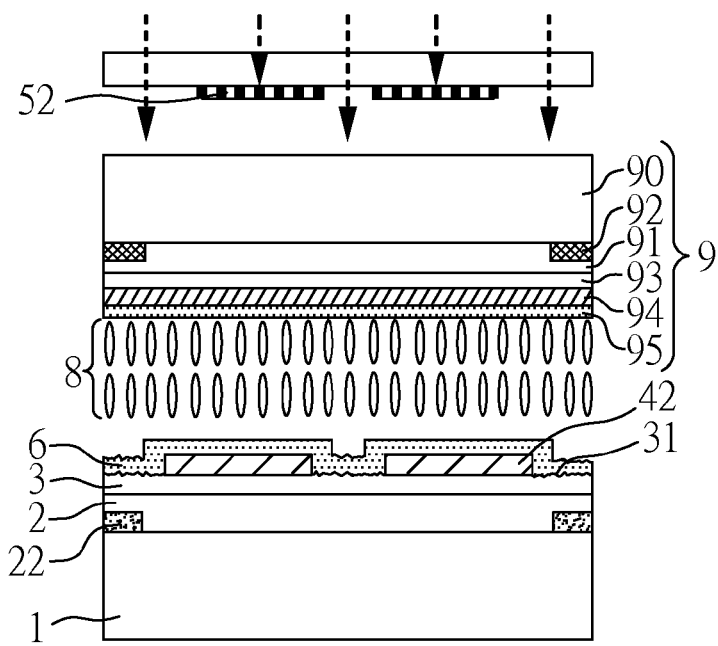
FIG. 1B shows a preparation scheme of the display panel according to another embodiment of the disclosure.

Alternatively, in another embodiment as shown in FIG. 1B, an etching solution is used to etch the transparent conductive layer 41 to form the pixel electrode 42 and expose part of the insulating layer 3 (i.e., an exposure region 31). The pixel electrode 42 can be formed by the aforementioned steps as shown in FIG. 1A or by other techniques well-known in the art without limitation. Then, an alignment layer 6 is disposed on the pixel electrode 42 and the exposure region 31, combined with a color filter substrate 9 and filling a liquid crystal layer 8, thereafter, a gray level mask 52 having a predetermined pattern is used for the exposure process (the illumination direction is indicated by the dashed arrows), wherein the light energy corresponding to the pixel electrode 42 is adjusted to be smaller, and the light energy corresponding to the exposure region 31 not covered by the pixel electrode 42 is adjusted to be larger. In another embodiment, the illumination time is so adjusted that the illumination time for the pixel electrode 42 is shorter, while the illumination time for the exposure region 31 not covered by the pixel electrode 42 is longer. Since the molecules of the alignment layer 6 and the photo-reactive monomers of the liquid crystal layer 8 may have different aggregation degrees according to the illumination time and intensity, when the alignment layer 6 and the liquid crystal layer 8 are subjected to a light for a longer time or having a higher intensity, the molecules of the alignment layer 6 and the liquid crystal layer 8 will have a higher aggregation degree than the molecules subjected to a light for a shorter time or having a lower intensity. The aggregation degree of the molecules in the alignment layer 6 and the liquid crystal layer 8 will affect the surface roughness of the alignment layer 6. For example, the part in which the molecules have a higher aggregation degree will have a larger surface roughness than the part in which the molecules have a lower aggregation degree. Thus, the surface roughness of the alignment layer 6 disposed on the exposure region 31 is larger than the surface roughness of the alignment layer 6 disposed on the pixel electrode 42. The surface roughness of the alignment layer 6 on the exposure region 31 is 1.1 to 3 times the surface roughness of the alignment layer 6 on the pixel electrode 42, and preferably 1.1 to 2 times. In one embodiment, the alignment layer 6 on the pixel electrode 4 has the surface roughness of 2.46 Ra and 2.89 Rq, while the alignment layer 6 on the exposure region 31 has the surface roughness of 4.17 Ra and 5.04 Rq.

The term "surface roughness" refers to the undulating degree of an object surface, and can be measured by a common instrument in this technical field. Surface roughness may be classified into many kinds. For example, common roughness values with respect to the structural variation in the height direction comprise: a center line average roughness (Ra), a square average roughness (Rq), a ten-point average roughness (Rz) and so on. The measurement method is not particularly limited, and may use, for example, a comparative sample method, a light cutting method, a light reflection method, a light wave interference method, a probe-type measuring method and so on.

Next, referring to FIG. 1C, the color filter substrate 9 includes a corresponding substrate 90, a color filter layer 91 and a black matrix 92 (BM), a protective later 93, a common electrode 94, and an alignment layer 95 in the present embodiment, wherein the liquid crystal layer 8 comprises a plurality of liquid crystal molecules; wherein the liquid crystal molecules 81 corresponding to the exposure region 31 and the liquid crystal molecules 82 corresponding to the pixel electrode 42 are aligned in different directions. This is because the alignment layer 6 corresponding to the exposure region 31 has a larger surface roughness, while the alignment layer 6 corresponding to the pixel electrode 42 has a smaller surface roughness. Under the influence of the high surface roughness of the alignment layer 6 corresponding to the exposure region 31, the liquid crystal molecules 81 are less susceptible to the electric field. As a result, the aggregation of these liquid crystal molecules 81 will be arranged vertically, not inclined by the electric field. In contrast, the liquid crystal molecules 82 of the alignment layer 6 corresponding to the pixel electrode 42 are inclined continuously due to the influence of the electric field. Therefore, since the liquid crystal molecules 81 on the alignment layer 6 of the high surface roughness are aggregated and less prone to incline by the electric field, light leakage is not liable to occur, thereby improving the contrast of the adjacent pixel electrodes 42 upon driving the display panel.

Figure 1C:
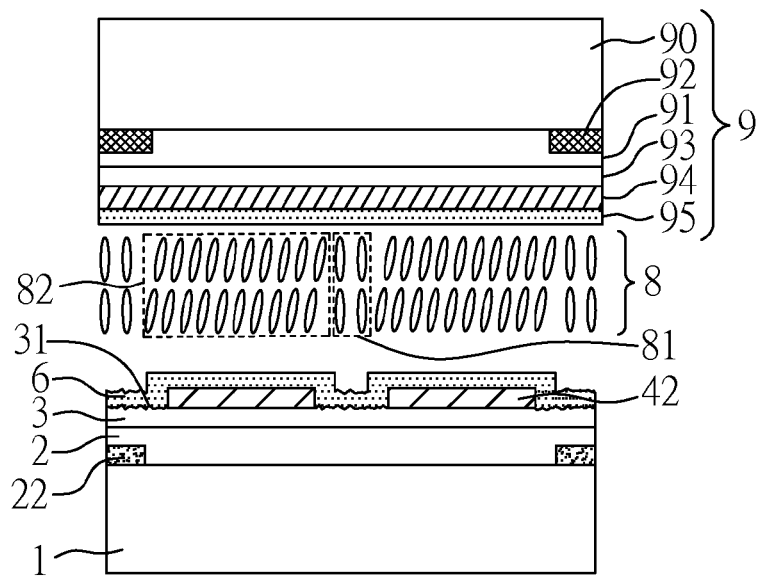
FIG. 1C shows a schematic diagram of the display panel according to an embodiment of the disclosure.
Figure 2:
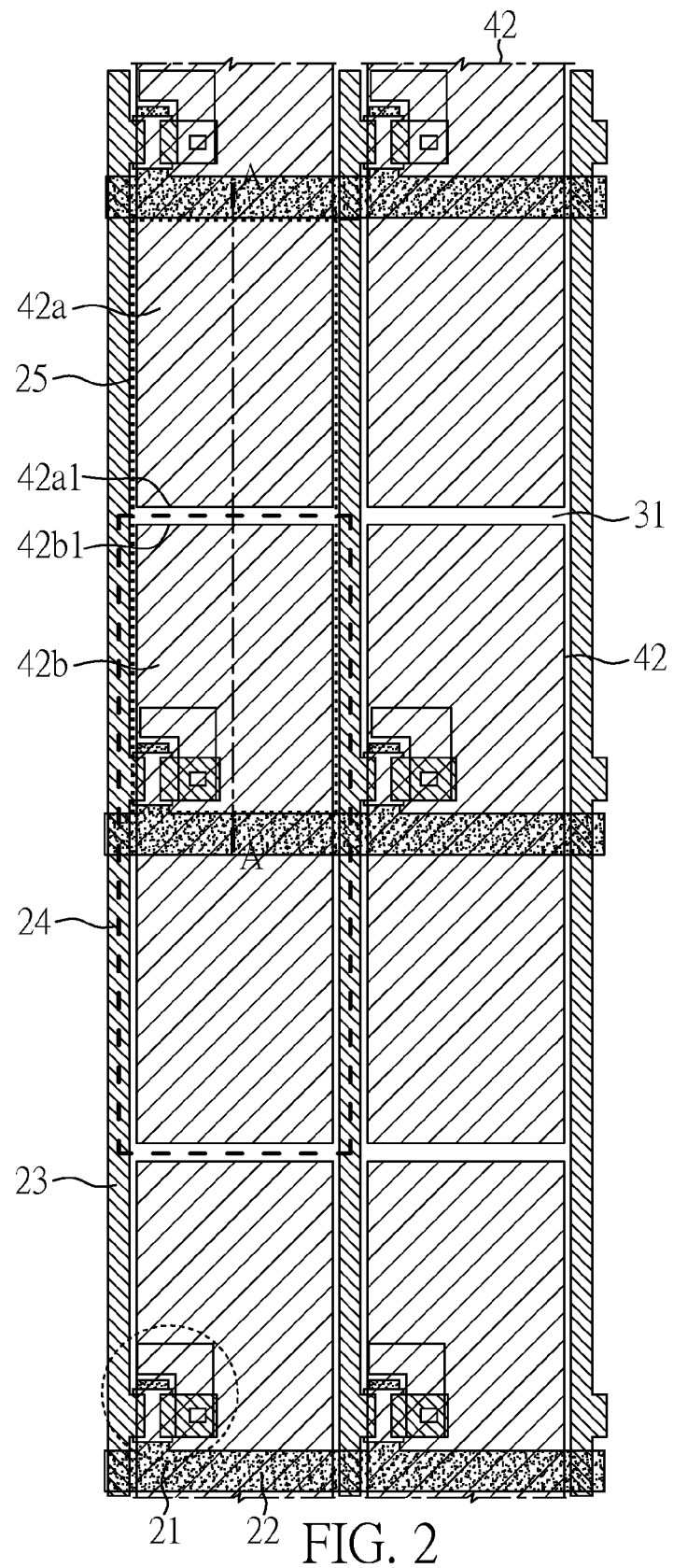
FIG. 2 shows a top view of the display panel according to a an embodiment of the disclosure.

Referring to FIG. 1C and FIG. 2, in which FIG. 2 is a schematic top view of the display panel according to the disclosure, and FIG. 1C shows a cross-sectional view of FIG. 2 along line AA'. In order to clearly illustrate the relative positions of the pixel electrodes 42, the substrate 1 and the insulating layer 3 under the pixel electrode 42, the alignment layer 6, the liquid crystal layer 8 and the color filter substrate 9 on the pixel electrode 42 are omitted from the drawings clarity. As shown in FIG. 2, the thin film transistor layer comprises a plurality of thin film transistors 21, a plurality of scan lines 22 and a plurality of data lines 23, wherein the scan lines 22 and the data lines 23 intersect each other to form a plurality of aperture areas 25. The first pixel electrode 42a and the second pixel electrode 42b of the pixel electrode 42 cross over one of the scan lines respectively, two ends of the first pixel electrode 42a and the second pixel electrode 42b are disposed in two adjacent aperture areas 25 respectively, and the adjacent ends 42a1, 42b1 of the first pixel electrode 42a and the second pixel electrode 42b are both disposed in one of the aperture areas 25. The first pixel electrode 42a and the second pixel electrode 42b belong to two sub-pixels 24 respectively, but no black matrix (BM) is provided between the first pixel electrode 42a and the second pixel electrode 42b. Because the first pixel electrode 42a and the second pixel electrode 42b of these pixel electrodes are disposed adjacent to and insulated from each other, the exposure region 31 is disposed between the adjacent first pixel electrode 42a and second pixel electrode 42b.

The above-mentioned black matrix 92 (BM) may be disposed corresponding to the scan lines 22 and the data line 23. In short, the black matrix 92 is disposed corresponding to the scan lines 22 and the data line 23 to avoid reflection of the external light due to their exposure, thereby deteriorating the display quality. In view of above, since the black matrix 92 is disposed corresponding to the scan lines 22 and the data line 23, and one of the pixel electrode 42 crosses over one of the scan lines 22, the black matrix also crosses over one of the pixel electrodes 42. However, the disclosure is not limited thereto. In this embodiment, the aperture area 25 formed between the adjacent scan line 22 and data line 23, and part of the two adjacent pixel electrodes 42 (with the end opposite to another pixel electrode 42) is disposed in the aperture area 25, while the portion between the two pixel electrodes 42 (corresponding to the exposure region 31) is not shielded by the black matrix 92 (BM).

In the disclosure, a thin film transistor layer 2 may be prepared by using a conventional process for preparing a bottom-gate or top-gate thin film transistor, and it will be not described here for brevity. The substrate 1 may be a glass substrate, a plastic substrate, a silicon substrate, a ceramic substrate, a flexible substrate or the like. Furthermore, the transparent conductive layer 42 and the pixel electrodes 42 may be made of a common transparent conductive material in the art, such as metal oxides of indium tin oxide (ITO), indium zinc oxide (IZO) or a combination thereof. The insulating layer 3 may be made of a passivation layer such as silicon nitride (SiNx), silicon oxide (SiOx) or a combination thereof, and may be selected in consideration of conditions such as leveling and capacitance matching. The photoresist layer 51 may be made of a photoresist material having a suitable photosensitivity, adhesiveness, etching resistance based on the process requirements. The alignment layer 6 may be a polyimide (PI) alignment film, for controlling the alignment direction of the liquid crystal molecules and providing pre-tilt angle of the liquid crystal molecules. The photo-reactive monomers can be contained in the liquid crystal layer 8 to conduct a polymerization while exposure to light, and the photo-reactive monomers are attached on the alignment layer 6 or react with the functional groups of the alignment layer 6, thereby influencing the pre-tilt angle of the liquid crystal molecules. However, the disclosure is not limited thereto. The display panel of the disclosure may be applied to any electronic device, such as displays, mobile phones, notebook computers, video cameras, cameras, music players, mobile navigation devices, televisions and the like, to enhanced the quality of the image.

For the purpose of brevity, some description will not be repeated, and as will be appreciated by a person skilled in the art, the descriptions in the aforementioned embodiment may also be applicable to the counterparts in the next embodiment.

Figure 3A:
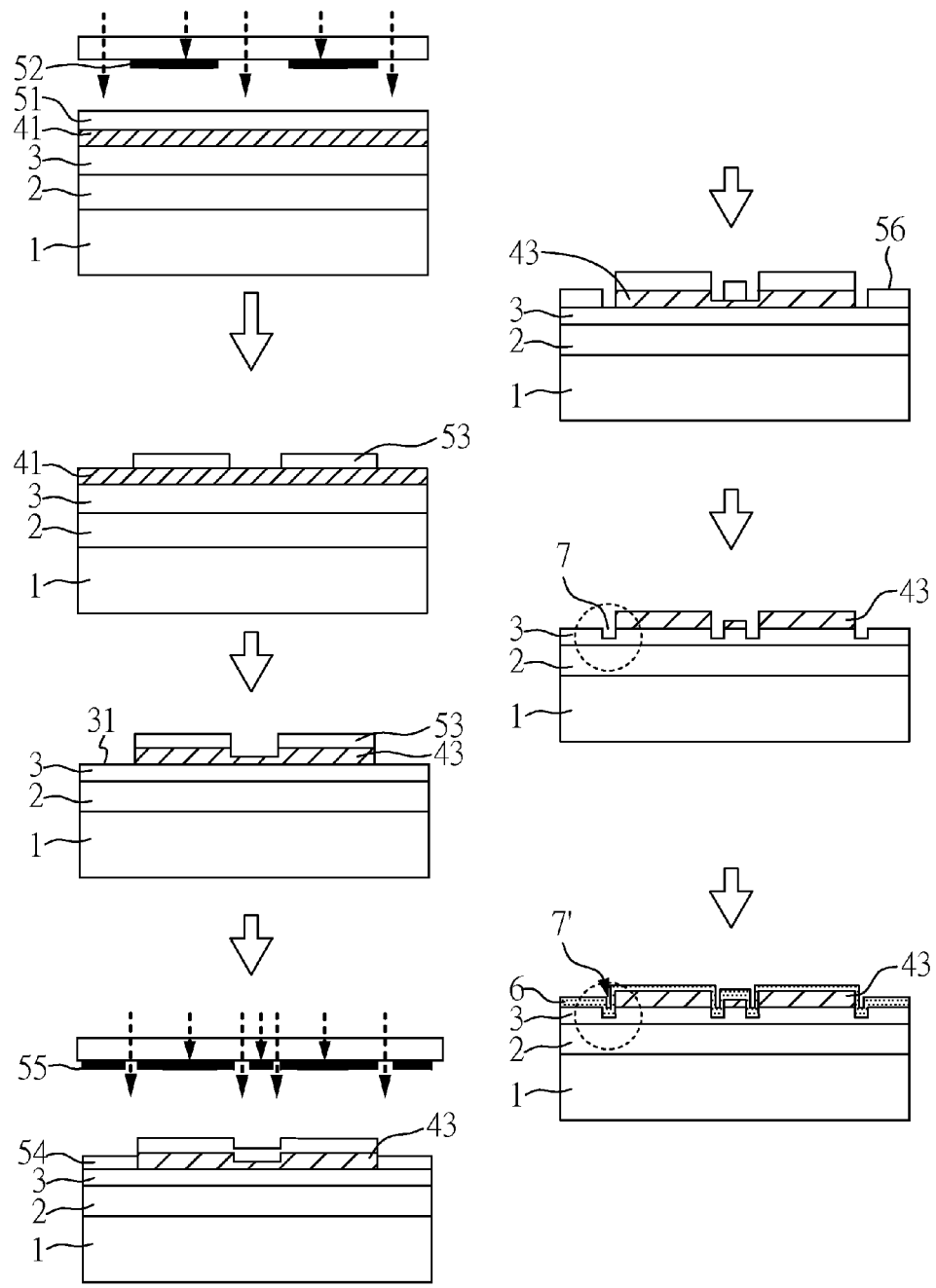
FIG. 3A shows a preparation scheme of the display panel according to a further embodiment of the disclosure.
Figure 3B:
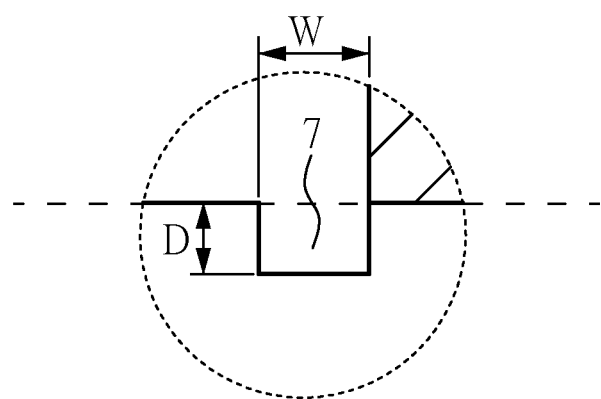
FIG. 3B shows a partially enlarged view of FIG. 3A.

The disclosure provides a display panel. Please refer to FIG. 3A, which shows a preparation scheme of the display panel. First, a substrate 1 is provided, and then a thin film transistor layer 2 is prepared on the substrate 1 by lithography and etching technology. After that, an insulating layer 3 is disposed on the thin film transistor layer, and a transparent conductive layer 41 is disposed on the insulating layer 3. Next, a photoresist layer 51 is provided on the transparent conductive layer 41, and a mask 52 having a predetermined pattern is employed for the exposure process (the illumination direction is indicated by the dashed arrows) to form a patterned photoresist 53, wherein the mask 52 can be a gray level mask; and then an etching solution is used to etch the transparent conductive layer 41 for patterning so as to form a pixel electrode 43 and expose part of the insulating layer 3 (i.e., an exposure region 31). Here, the transparent conductive layer 41 is not completely etched, resulting in an electrical connection between the adjacent pixel electrodes 43. Next, the patterned photoresist 53 is removed, and another photoresist layer 54 is disposed by using lithography and etching processes again. Another mask 55 having the predetermined pattern is employed for an exposure process (the illumination direction is indicated by the dashed arrows) to form a patterned photoresist 56, and then an etching solution is used to etch the transparent conductive layer 43 for patterning, so as to etch a recess 7 on the insulating layer 3 and the recess 7 is disposed adjacent to a sidewall of the pixel electrode 43, thereby disconnecting the portion which is not completely etched between the pixel electrodes 43, such that the short circuit between the adjacent pixel electrodes 43 can be avoided. A partially enlarged view of the recess 7 is shown in FIG. 3B. The width W of the recess is 0.1 μm to 5 μm, and preferably 0.1 μm to 3 μm. The depth D of the recess is 1 nm to 100 nm, and preferably 1 to 30 nm. Finally, the patterned photoresist 56 is removed, and then an alignment layer 43 is formed on the pixel electrode 31 and the exposure region 6, wherein since the recess 7 is formed on the insulating layer 3 by etching and is disposed adjacent to a sidewall of the pixel electrode 43, a recess 7' may be also provided on the alignment layer 6 between the exposure region 31 and the pixel electrode 43, and the recess 7' may be disposed adjacent to the sidewall of the pixel electrode 43. It means the alignment layer 6 has a recess 7' between the pixel electrode 43 and the exposure region 31.

Accordingly, in the embodiments of the disclosure, since the surface roughness of the alignment layer on the exposure region is larger than the surface roughness of the alignment layer on the pixel electrode, the alignment direction of the liquid crystal molecules of the liquid crystal layer is changed by the influence of the uneven alignment layer. Upon driving the display panel, the liquid crystal molecules disposed on the alignment layer corresponding to the pixel electrodes are arranged obliquely by the effect of the electric field; while the liquid crystal molecules disposed on the alignment layer corresponding to the exposure region are less susceptible to the electric field due to its larger surface roughness, so the liquid crystal molecules are less prone to incline by the electric field and where light is not easily to pierce therethrough, forming a region appearing darker than other regions to increase the contrast between the adjacent pixels. As a result, upon driving the display panel, light leakage is not likely to occur even at the area without the shielding of the black matrix (BM), thus improving the contrast between the adjacent pixel electrodes.

While the invention has been shown and described with reference to certain exemplary examples thereof, it will be understood by those skilled in the art that various changes in form and details may be made therein without departing from the scope of the invention as defined by the appended claims.

What is claimed is:

1. A display panel, comprising:
   a first substrate;
   a thin film transistor layer disposed on the first substrate;
   an insulating layer disposed on the thin film transistor layer;
   at least one pixel electrode disposed on the insulating layer and exposing an exposure region of the insulating layer; and
   an alignment layer disposed on the pixel electrode and the exposure region;
   wherein a surface roughness of the alignment layer on the exposure region is larger than a surface roughness of the alignment layer on the pixel electrode.

2. The display panel of claim 1, wherein the surface roughness of the alignment layer on the exposure region is 1.1 to 3 times the surface roughness of the alignment layer on the pixel electrode.

3. The display panel of claim 1, wherein a recess is formed on the insulating layer and is disposed adjacent to a sidewall of the pixel electrode.

4. The display panel of claim 1, wherein the alignment layer has a recess between the pixel electrode and the exposure region.

5. The display panel of claim 3, wherein a width of the recess is 0.1 μm to 5 μm.

6. The display panel of claim 3, wherein a depth of the recess is 1 nm to 100 nm.

7. The display panel of claim 1, wherein the thin film transistor layer comprises a plurality of scan lines and a plurality of data lines, which intersect each other to form a plurality of aperture areas, the at least one pixel electrode comprises at least one first pixel electrode, and one of the first pixel electrodes crosses over one of the scan lines.

8. The display panel of claim 7, wherein the first pixel electrode crossing over one of the scan lines and two ends of the first pixel electrode are located at the two adjacent aperture areas, respectively.

9. The display panel of claim 7, wherein the at least one pixel electrode further comprises at least one second pixel electrodes which are disposed adjacent to and insulated from the first pixel electrodes, and adjacent ends of one of the first pixel electrode and one of the second pixel electrode are both located at one of the aperture areas.

10. The display panel of claim 9, wherein the exposure region is disposed between the first pixel electrode and the second pixel electrode adjacent to each other.

\* \* \* \* \*